United States Patent [19]

Berggren

[11] Patent Number: 4,747,075
[45] Date of Patent: May 24, 1988

[54] APPARATUS FOR STORING ANALOG SIGNAL SAMPLES

[75] Inventor: Lars G. Berggren, Gothenburg, Sweden

[73] Assignee: Telefonaktiebolaget LM Ericsson, Stockholm, Sweden

[21] Appl. No.: 829,789

[22] Filed: Feb. 14, 1986

[30] Foreign Application Priority Data

Mar. 8, 1985 [SE] Sweden ............................ 8501142

[51] Int. Cl.$^4$ ............................................ G11C 27/00
[52] U.S. Cl. ..................................................... 365/45
[58] Field of Search ........................................ 365/45

[56] References Cited

U.S. PATENT DOCUMENTS 3,999,171 12/1976 Parsons ................................. 365/45
4,156,286 5/1979 Connors et al. ....................... 365/45

FOREIGN PATENT DOCUMENTS 1512136 5/1978 United Kingdom .

OTHER PUBLICATIONS

O. R. Buhler et al., "Analog-to-Digital Converter Checking Circuit", IBM Technical Disclosure Bulletin, vol. 22, No. 8 B, Jan. 1980, pp. 3618-3619.

Primary Examiner—Joseph A. Popek
Attorney, Agent, or Firm—Roberts, Spiecens & Cohen

[57] ABSTRACT

Storage of an analog signal sample is achieved by converting the incoming analog sample to a digital sample, by storing the digital sample in a digital memory (7) and by converting the sample read from the memory to an outgoing analog sample. Very good likeness between the incoming and outgoing samples is attained by using, due to a writing order for the analog-digital conversion a conventional closed loop comprising an analog comparator (2), an iterative logic (3) and a digital-analog converter (6), as well as by disconnecting the digital-analog converter (6) by disconnection elements (4 and 5) when the logic (3) has completed the iterative process, as well as by connecting, due to a reading order the reading output of the memory (7) to the converter (6) which then generates the outgoing analog sample. A control unit (9) prevents reading from the memory (7) when an iterative process is in progress.

7 Claims, 2 Drawing Sheets

APPARATUS FOR STORING ANALOG SIGNAL SAMPLES

FIELD OF THE INVENTION

The present invention relates to an apparatus for storing analog signal samples, which includes a circuit for analog-digital conversion, a digital memory for storing digital signal samples and a digital-analog converter.

BACKGROUND

Ever since digital memories have been used for storing digital words, analog signal samples have been converted to digital signal samples and the digital words representing the samples have been stored in a digital memory. After optionally long storage times, the words representing the digital samples have been retrieved by reading from the memory. A digital-analog (D/A) converter is used to retrieve the corresponding analog signal samples.

This principle of storing a random number of analog signal samples, e.g. by using their individual addresses in the digital memory, is superior to the even older storage principle where the analog signal samples are each stored in individual sampling and holding circuits. This superiority mainly depends on the storage time of an analog holding circuit being limited if there is a demand that an analog signal sample shall be the same before and after storage.

With an operationally reliable digital memory, a digital word is always the same before and after storage, but the accuracy in storing an analog signal sample using a digital memory depends on how exactly the characteristic for analog-digital conversion used before storage agrees with the characteristic for digital-analog conversion used after storage. For good accuracy it is required that the D/A converter be tuned in exactly with the analog-digital conversion circuit. If satisfactory characteristic tuning and satisfactory compensation of the differences between the necessary amplifiers are technically possible at all, they will in any case be very expensive.

SUMMARY OF THE INVENTION

To enable optionally long storage, a digital memory is also used in the inventive apparatus. Very good accuracy is afforded by the invention, without the tuning mentioned above, by using a closed loop, known per se, for the analog-digital conversion, this loop including a D/A converter with a calculated conversion characteristic, an analog comparator and an iterative logic, and by disconnecting the loop D/A converter and using it to retrieve the analog signal sample after it has been stored in the digital memory. The accuracy of the apparatus is substantially dependent on how steadily an analog signal sample coming to the comparator is held, while the logic and comparator perform repeated analog amplitude comparisons, and on what number of digital signal samples is selected for sufficiently exactly representing, with the aid of the digital samples, an optional analog sample intended for storage. But the accuracy of the apparatus is independent of how much the true characteristic of the D/A converter deviates from the calculated characteristic, due to temperature and aging.

The state of the art, of which knowledge is required in order to understand the invention, is described by Eugene L. Zuch in "Data Acquisition and Conversion Handbook".

According to the invention, the same D/A converter is employed in the closed loop circuit and for converting the stored digital signal samples to analog samples at the output.

The invention specifically contemplates storage and retrieval of an analog signal sample by converting the incoming analog sample to a digital sample, by storing the digital sampling in a digital memory and by converting the sample read from the memory to an outgoing analog sample. Very good likeness between the incoming and outgoing samples is attained by using, due to a writing order for the analog-digital conversion, a conventional closed loop comprising an analog comparator, an iterative logic and a digital-analog converter, as well as by disconnecting the digital-analog converter by disconnection means when the logic has completed the iterative process, as well as by connecting, due to a reading order, the reading output of the memory to the converter which then generates the outgoing analog sample. A control unit prevents reading from the memory when an iterative process is in progress.

BRIEF DESCRIPTION OF THE FIGURES OF THE DRAWINGS

The invention will be described in detail with reference to the accompanying drawing, in which.

DETAILED DESCRIPTION OF A BEST MODE FOR CARRYING OUT THE INVENTION

Figure 1:
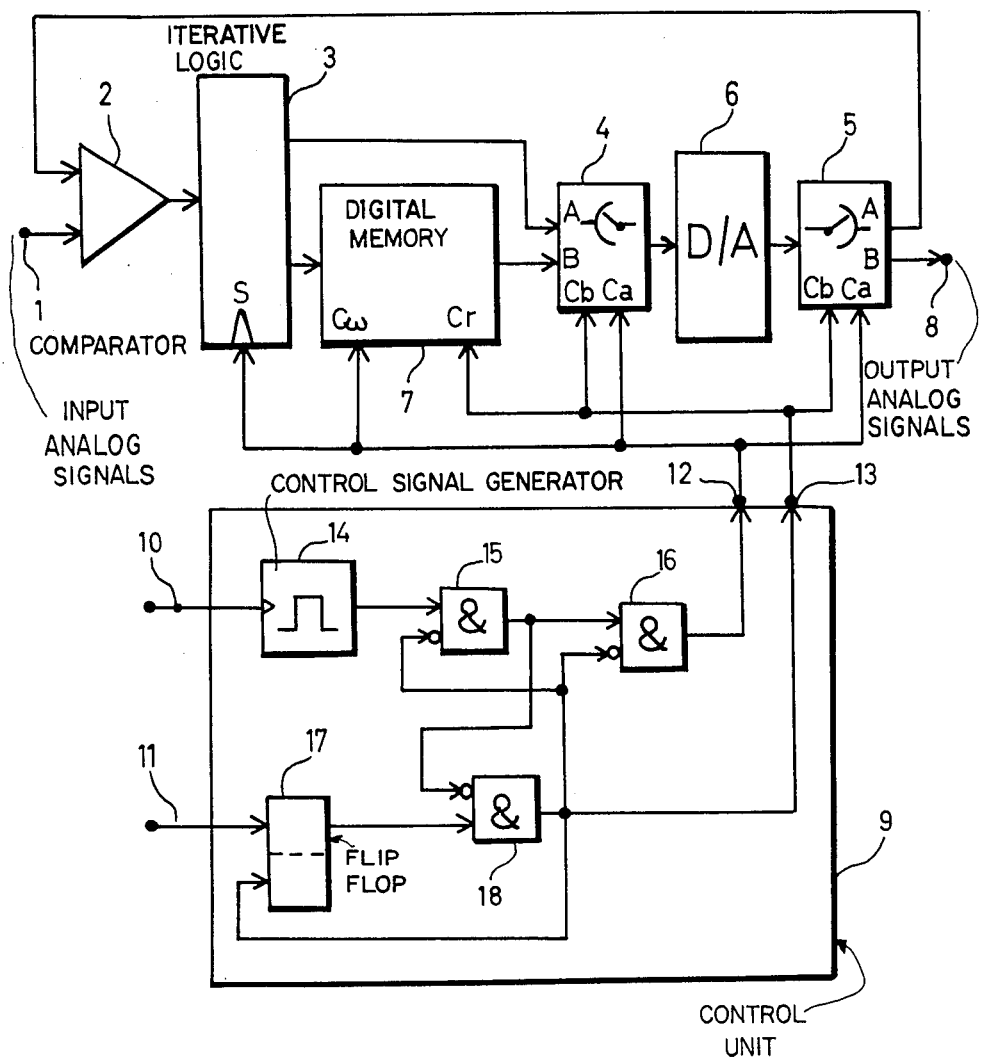
FIG. 1 diagrammatically illustrates a general embodiment of the inventive apparatus.

FIG. 1 illustrates an apparatus for storing analog signal samples. A terminal 1 serves for receiving analog samples from an illustrated holding circuit and is connected to a first input of an analog comparator 2 included in a conventional closed loop. The loop further includes an iterative logic 3 and a D/A converter 6 connected to disconnection means 4 and 5. Upon activation of the inputs Ca of the disconnection means, the converter input is connected to a first output of the iterative logic, and the converter output is connected to the second input of the comparator.

When a starting pulse is applied to the logic dynamic input S, the generation of a digital sample sequence is started, the samples being sent one at a time to the D/A converter for conversion to analog samples, which are compared by the comparator with the incoming signal sample, the output of the comparator being connected to the logic input. The digital sample sequence is composed such that the comparator sends to the logic 3, difference values decreasing in steps. When the iterative process has arrived at the digital sample word giving the least possible difference value, the logic sends this digital sample to a conventional digital memory 7, which is activated for writing by a control signal at its input Cw.

If the memory 7 is a register for storing a single digital word, the storage capacity of the apparatus is limited to a single analog signal sample at a time. If a FIFO memory is used, several samples may be stored simultaneously, the addressing of places in the memory for writing and reading digital words automatically being determined by the FIFO rule. Optionally varying storage times are enabled by the use of a random access memory (RAM) in combination with an address calculating unit, which sends, in conjunction with writing or reading, a relevant memory place address to the address register of the memory. The drawing does not show any function block for addressing the memory, since addressing is outside the scope of the invention.

For retrieving a stored sample from the apparatus, the memory 7 is activated for reading by a control signal at its input Cr. The read control signal is also sent to control inputs Cb of the disconnection means 4 and 5, whereby the respective input and output on the D/A converter 6 are connected respectively to the memory output and apparatus terminal 8 for outgoing analog signal samples.

The advantage of using the same D/A converter for input and output of analog signal samples has already been discussed. On the other hand, the apparatus must include a control unit to prevent collision between input and output, i.e. to prevent the memory from being simultaneously activated for reading and writing, with the D/A converter being simultaneously fed from the memory and the iterative logic.

The control unit 9 illustrated in FIG. 1 is provided with inputs 10 and 11 for receiving write and read order pulses, respectively, and with an output 12 connected to the dynamic input S of the logic 3, to the write control input Cw of the memory 1 and to the inputs Ca of the disconnection means 4,5, for transmitting control signals to make the apparatus available for writing and provided with an output 13 connected to the memory read control input Cr and the control inputs Cb of the disconnection means, for transmitting control signals to make the apparatus available for reading.

The order pulses are assumed to arrive asynchronously and in random order via the two inputs 10 and 11, but for two successive orders of the same type, the first one coming in must always be completed before the other one comes in. A writing operation, which includes an iterative process and thus a plurality of D/A conversions, has a very much longer processing time than a reading operation, which only embraces a single D/A conversion.

Figure 2:
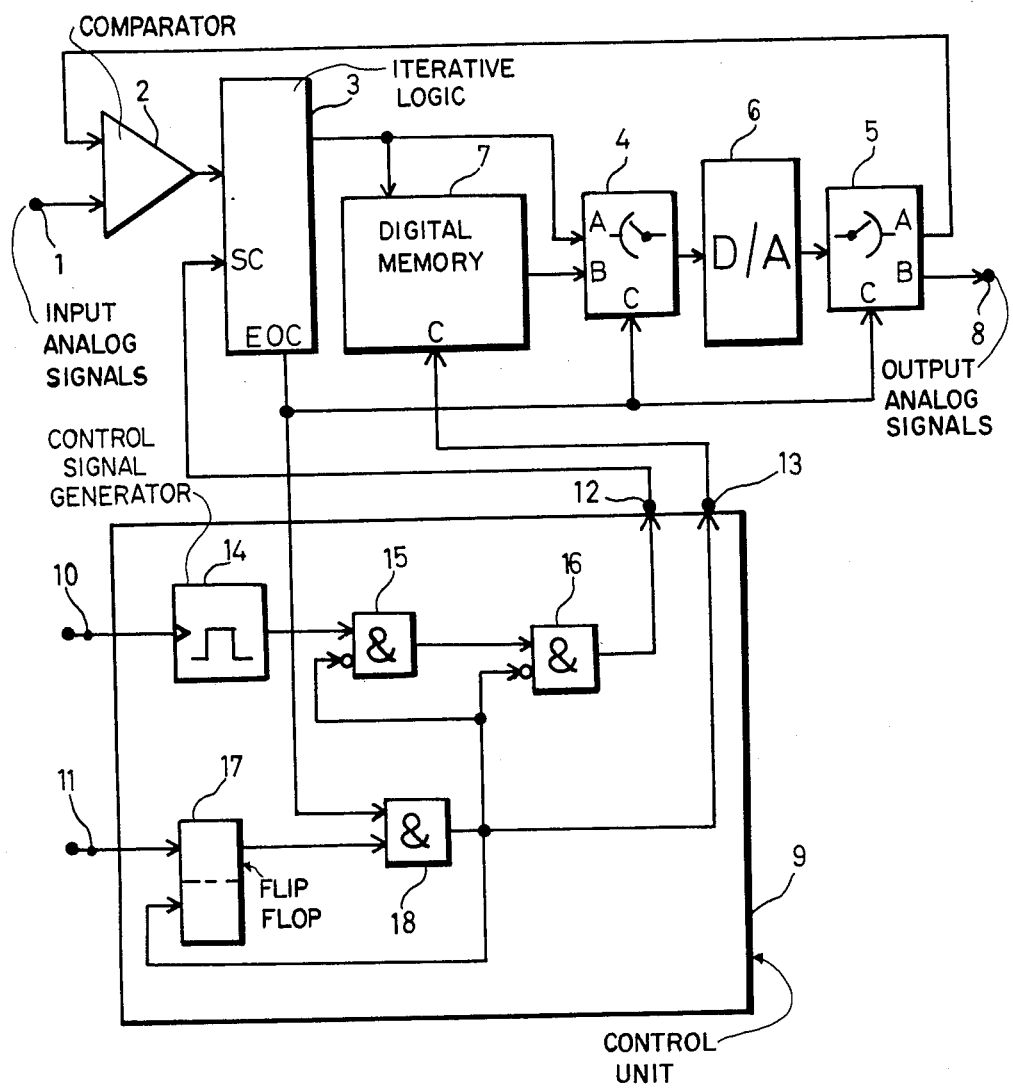
FIG. 2 illustrates a special embodiment including a standardized "Successive Approximation Register."

The control unit 9, illustrated in FIG. 1, includes single-shot element 14 for generating a control signal which is at least as long as the sum of the processing periods required for one write-in and one read-out. The input of element 14 is connected to the input 10 of the control unit. A first AND gate 15 has its first input connected to the output of the element 14, and its output connected to a first input of a second AND gate 16, the output of which is connected to the control unit output 12. The control unit also includes a bistable flip-flop 17, the energizing input of which is connected to the control unit input 11. A third AND gate 18 has its first input connected to the flip-flop output and its output connected to the control unit output 13 and to the de-energizing input of the flip-flop. It is assumed that the flip-flop 17 and gate 18 together have a reaction time that is at least as long as the processing time for one read-in. The three AND gates 15, 16 and 18 are each provided with a second inverting input, and these are connected so that in an energized state, the gate 15 blocks the gate 18, and when the gate 18 is energized it blocks the gates 15 and 16. FIG. 2, using the same reference numerals as FIG. 1, illustrates an inventive apparatus in which the iterative logic 3 is a standard register such as to one made by Motorola under the code number MC 14549 B, and marketed as a "Successive Approximation Register". The standardized register is provided with a start input SC and an output EOC which sends a binary "0" or "1" while successive approximation is in progress or not, respectively. The disconnection means 4 and 5 and the digital memory 7, illustrated in FIG. 2, each have a control signal input C, and for a binary "0" control signal thereon assumes the state required for writing, and for a binary "1" control signal theron assumes the state required for reading. The control unit illustrated in FIG. 2 is different from the one in FIG. 1 inasmuch as the single-shot element 14 generates a control signal which is at least as long as the processing period for one read-out, and that the control unit outputs 12 and 13 are respectively connected to the register input SC and the control input C on the digital memory 7. A further difference is the arrangement of two non-inverting inputs on the gate 18 in FIG. 2, one of these inputs being connected, as are the control inputs C of the disconnection means, to the register output EOC.

With the aid of the control units 9 and 9' illustrated in FIGS. 1 and 2 respectively there is obtained that a reading order coming in during a writing operation in progress, or a writing order coming in during a reading operation in progress, is not executed by means of gates 15 and 18, until the operation in progress is completed, and that reading is given priority by gate 16 upon simultaneous reception of reading and writing orders.

What is claimed is:

1. Apparatus for storing and retrieving analog signal samples comprising:
   (a) means including a closed loop for convering by an iterative process an incoming analog signal sample to a digital sample, said loop including a digital-analog converter having an input and an output, an analog comparator having first and second inputs and an output, said first input receiving the analog signal sample, and an iterative logic having an input connected to the output of said comparator for producing by an iterative process a digital sequence of an analog signal at the output of the comparator, said iterative logic having an output which can be connected to said converter, said output of said converter being connectable to said second input of said comparator such that in said closed loop the analog signal at the output of the comparator travels to said iterative logic whose output digital signal travels to said converter and the resulting analog signal is then fed to the second input of the comparator;
   (b) a digital memory having a writing input and reading output, said output of said interative logic being connected to the writing input of said digital memory;
   (c) disconnection means for disconnecting the digital-analog converter from the loop and connecting the converter input to the reading output of the memory, the output signal at said converter then constituting the output of the apparatus; and
   (d) control means operatively connected to the memory and to said disconnection means for preventing, in an iterative process in progress in said iterative logic, reading a digital sample stored in the memory, and for controlling, by connection of the converter to the memory and to said output of the apparatus, reading from the memory and conversion of the digital sample to an analog sample for supply at the output of the apparatus.

2. Apparatus as claimed in claim 1 wherein said iterative logic has a dynamic input, said disconnection means includes first and second disconnection elements connected in said loop respectively to said input and output of said converters said disconnection elements having respective control inputs, said control means being connected to said dynamic input of said iterative logic and to said control inputs of said first and second disconnection elements.

3. Apparatus as claimed in claim 2 wherein said memory has a reading input, each disconnection element having two said control inputs for selectively connecting the converter in the closed loop or to said output of the apparatus, said control means having one output connected to said dynamic input of the iterative logic and to one of the control inputs of the first and second disconnection elements and a second output connected to the other of the control inputs of the first and second disconnection elements.

4. Apparatus as claimed in claim 3 wherein said control means has read and write inputs and comprises timing means and gate means for controlling the supply of signals at said read and write inputs to said outputs of the control means.

5. Apparatus as claimed in claim 1 wherein said iterative logic has a start input and a binary output indicative of whether the iterative process is in progress or not, said memory has a control signal input, said disconnection means includes first and second disconnection elements connected in said loop respectively to the input and output of said convertor, said disconnection elements having respective control inputs, said control means having one output connected to the start input of said iterative logic and a second output connected to said control signal input of said memory, said binary output being connected to said control inputs of said disconnection elements.

6. Apparatus as claimed in claim 5 wherein said control means has read and write inputs and comprises timing means and gate means for controlling the supply of signals at said read and write inputs to said outputs of the control means.

7. A method for storing and retrieving analog signal samples comprising supplying input analog signals to a comparator, converting output signals from said comparator to digital signals in an iterative process in a closed loop circuit containing a digital-analog converter whose output is supplied to a second input of the comparator, feeding the digital signals to a digital memory for storage, switching the connection of the input of the converter from the closed loop circuit to a reading output of the memory while disconnecting the output of the converter to the second input of the comparator to produce at said output of the converter analog signals corresponding to the stored digital signals in said memory when analog signal samples are to be retrieved and controlling the switching of the connection of the input of the converter to said memory to prevent reading a digital signal therein while the iterative process is in progress in said closed loop circuit.

* * * * *